United States Patent
Sakai et al.

(10) Patent No.: US 6,603,154 B2
(45) Date of Patent: Aug. 5, 2003

(54) SEMICONDUCTOR PACKAGE AND METHOD OF MANUFACTURING SEMICONDUCTOR PACKAGE

(75) Inventors: Yoshinori Sakai, Sasayama (JP); Kazuhiro Nobori, Katano (JP); Kazuo Arisue, Tondabayashi (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/814,964

(22) Filed: Mar. 23, 2001

(65) Prior Publication Data

US 2002/0019078 A1 Feb. 14, 2002

(30) Foreign Application Priority Data

Mar. 24, 2000 (JP) .................................... 2000-084406

(51) Int. Cl.[7] ............................................. H01L 23/495
(52) U.S. Cl. ........................................ 257/166; 257/167
(58) Field of Search ............................. 257/666, 668, 257/671, 675, 690, 696, 701; 438/122, 125; H01L 23/495

(56) References Cited

U.S. PATENT DOCUMENTS

| | | | | |
|---|---|---|---|---|
| 4,931,853 A | * | 6/1990 | Ohuchi et al. | 257/679 |
| 5,347,146 A | * | 9/1994 | Soh | 257/59 |
| 6,201,696 B1 | * | 3/2001 | Shimizu et al. | 361/704 |
| 6,211,527 B1 | * | 4/2001 | Chandler | 250/492.2 |
| 6,239,983 B1 | * | 5/2001 | Shingai et al. | 361/768 |
| 6,291,880 B1 | * | 9/2001 | Ogawa et al. | 257/723 |
| 6,310,393 B1 | * | 10/2001 | Ogura et al. | 257/723 |
| 6,338,783 B1 | * | 1/2002 | Inoue et al. | 204/425 |
| 6,396,157 B2 | * | 5/2002 | Nakanishi et al. | 257/781 |

* cited by examiner

Primary Examiner—Don Wong
Assistant Examiner—Trinh Do Dinh
(74) Attorney, Agent, or Firm—Wenderoth, Lind & Ponack, L.L.P.

(57) ABSTRACT

A lower electrode of a semiconductor is directly connected to a heat sink, while a first electrode and a second electrode are connected to a plate-shaped second conductor by means of a first conductor. Radiated heat of the semiconductor is directly conducted to the heat sink and absorbed. The heat is radiated by being further conducted to the plate-shaped second conductor via the first conductor, thereby allowing the semiconductor to have a reduced temperature.

10 Claims, 4 Drawing Sheets

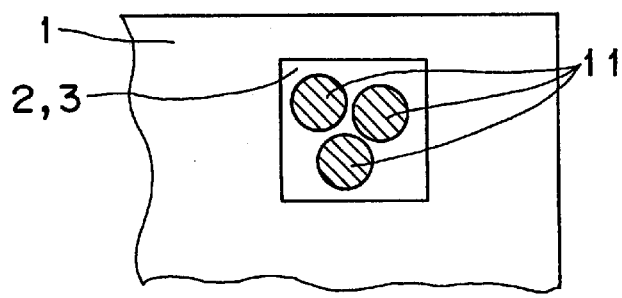
Fig. 6A
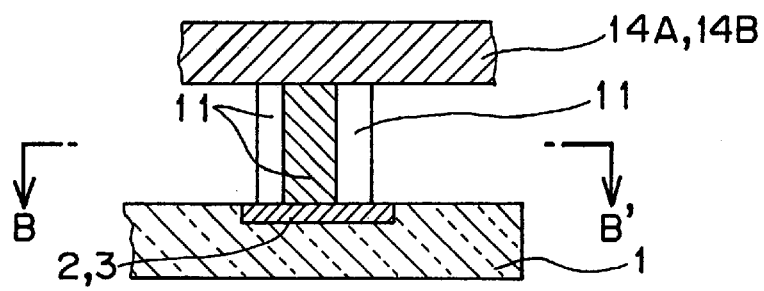
Fig. 6B
Fig. 7A  Fig. 7B  Fig. 7C
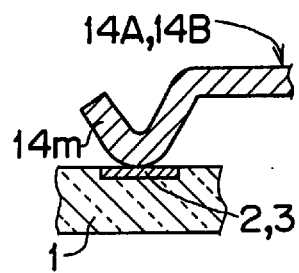 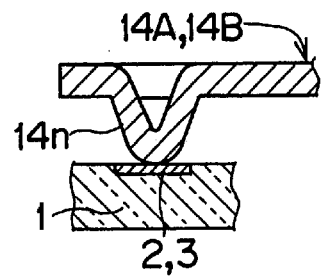 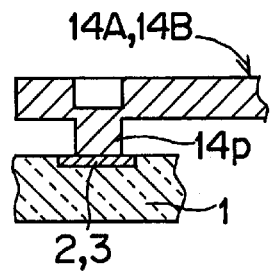
Fig. 8
(PRIOR ART)
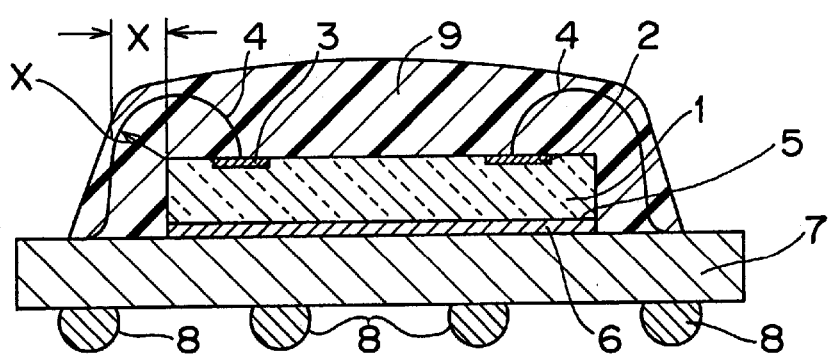

SEMICONDUCTOR PACKAGE AND METHOD OF MANUFACTURING SEMICONDUCTOR PACKAGE

BACKGROUND OF THE INVENTION

1. Field of the Invention

The present invention relates to a semiconductor package and a semiconductor package manufacturing method, which are used for electronic equipment and able to improve the heat radiation characteristic of a semiconductor of a large calorific value for a power supply circuit or the like.

2. Description of the Related Art

In recent years, semiconductors are components indispensable for the circuit formation of electronic equipment, and the mounting forms thereof are variously examined and used. In the prior art, there is employed a package form of which the handling and mounting are facilitated, as shown in FIG. 8.

An example of the aforementioned conventional method will be described below with reference to the drawing.

FIG. 8 shows a cross section of the conventional semiconductor package form.

A semiconductor 1 has an upper a-electrode 2 and an upper b-electrode 3 located on one surface and a lower electrode 5 located on the entire other surface. A circuit board 7 has a specified circuit pattern on both of its surfaces. Both the surfaces are connected to each other via through hole conductors (not shown), and one circuit is formed on both the surfaces. Furthermore, to a circuit pattern of the circuit board are sometimes connected balls 8 formed principally of the material of gold, silver, copper, or solder employed as connectors for connection to other electric circuits, thereby facilitating the connection to other electric circuits.

The semiconductor 1 and the circuit board 7 are connected to each other to form a semiconductor package. First of all, the lower electrode 5 is connected to the circuit pattern of the circuit board 7 with solder 6. For the connection of the lower electrode 5 to the circuit pattern, there is occasionally employed a conductive paste or gold in place of the solder 6.

On the other hand, the upper a electrode 2 and the upper b-electrode 3 are connected to the circuit pattern by a wire bonding method generally with a gold wire or an aluminum wire 4.

In this stage, the gold wire or the aluminum wire 4 is, of course, not permitted to come in contact with the portions other than the a-electrode 2 and the b-electrode 3, which are located on the upper side of the semiconductor 1, and a specified distance X must be maintained for the purpose of securing reliability and safety. The distance X is varied depending on the working voltage and current, and therefore, no detail is provided therefor.

Next, in order to protect the circuit constituent portion constructed principally of the semiconductor 1, the semiconductor package is formed with improved protection and handling by covering the surface of the circuit board 7 for mounting the semiconductor 1 so as not to deform the gold wires or aluminum wires 4 used as connectors with an insulating resin 9.

Methods for supplying the insulating resin 9 include a molding method with a die, a method for pouring melted resin, and a method for covering the whole body by placing a powdery or granular resin on the upper surface of the semiconductor 1 and melting the resin by heating.

However, with the above-mentioned construction, the circuit board has a small heat radiation effect when the calorific value of the semiconductor becomes large, or thermal conduction loss occurs even if a circuit board formed of ceramic of good thermal conductivity is employed for the radiation of heat to a heat sink (heat radiation board) or the like. Moreover, the gold wire or aluminum wire has a limit in wire diameter size for wire bonding and is required to be used within the respective allowable current capacities with regard to the wire diameter thereof. Moreover, to cope with a large current, several wires are required to be connected to an electrode located in one place. Furthermore, it is required to secure an inter-electrode distance as the current value increases, and there is an issue that the inter-electrode distance is hard to secure due to variations in wire shape at the time of wire bonding, deformation in the subsequent processing stages, and so on when the gold wire or the aluminum wire is used.

Accordingly, the object of the present invention is to solve the aforementioned issues and provide a semiconductor package and a semiconductor package manufacturing method capable of improving the heat radiation characteristic of a semiconductor of a large calorific value for a power supply circuit or the like.

SUMMARY OF THE INVENTION

In order to achieve the aforementioned object, the present invention is constructed as follows.

According to a first aspect of the present invention, there is provided a semiconductor package manufacturing method comprising:

connecting to a heat sink a lower electrode arranged on one surface of both surfaces of a power supply semiconductor that has electrodes on both its surfaces, and connecting a first conductor that has a spherical, convex, or rod-like shape to each of the first electrode and the second electrode arranged on the other surface of both the surfaces of the semiconductor;

forming a first insulating section by covering the semiconductor with a first insulating resin except a connecting portion of the first conductor and a lower surface of the heat sink;

connecting a plate-shaped second conductor to the connecting portion of the first conductor; and thus manufacturing a semiconductor package.

According to a second aspect of the present invention, there is provided a semiconductor package manufacturing method comprising:

connecting to a heat sink a lower electrode arranged on one surface of both surfaces of a power supply semiconductor that has electrodes on both its surfaces, and connecting a first conductor that has a spherical, convex, or rod-like shape to each of the first electrode and the second electrode arranged on the other surface of both the surfaces of the semiconductor;

connecting a second conductor to a connecting portion of the first conductor;

forming a first insulating section by covering the semiconductor with a first insulating resin except a lower surface of the heat sink and a connecting portion of the second conductor; and thus manufacturing a semiconductor package.

According to a third aspect of the present invention, there is provided a semiconductor package manufacturing method comprising:

connecting to a heat sink a lower electrode arranged on one surface of both surfaces of a power supply semiconductor that has electrodes on both its surfaces, and connecting a first conductor that has a spherical, convex, or rod-like shape to each of the first electrode and the second electrode arranged on the other surface of both the surfaces of the semiconductor;

connecting a plate-shaped second conductor to a connecting portion of the first conductor;

forming an insulating section by covering whole body with an insulating resin, and thereafter removing the insulating resin of a lower surface of the heat sink and a connecting portion of the second conductor; and thus manufacturing a semiconductor package.

According to a fourth aspect of the present invention, there is provided a semiconductor package manufacturing method as defined in any one of the first to third aspects, wherein the first conductor has a stepped shape and includes a small-diameter portion to be fit in a hole of the second conductor, a large-diameter portion that is thicker than the small-diameter portion and able to be engaged with a periphery of the hole of the second conductor, and a stepped portion arranged at a boundary between the small-diameter portion and the large-diameter portion, and the second conductor is connected to the connecting portion of the first conductor by engaging the periphery of the hole of the second conductor with the large-diameter portion while fitting the small-diameter portion that serves as the connecting portion of the first conductor into the hole of the second conductor.

According to a fifth aspect of the present invention, there is provided a semiconductor package manufacturing method as defined in any one of the first to third aspects, wherein the first conductor is connected to the second conductor in a state in which a lower surface of the second conductor pushes against and comes into contact with an upper end surface of the first conductor.

According to a sixth aspect of the present invention, there is provided a semiconductor package manufacturing method as defined in any one of the first to fifth aspects, wherein the first conductor has an uneven portion on its side surface, and the first insulating resin twines around the uneven portion of the side surface of the first conductor.

According to a seventh aspect of the present invention, there is provided a semiconductor package manufacturing method as defined in any one of the first to sixth aspects, wherein the insulating resin has great thermal conductivity.

According to an eighth aspect of the present invention, there is provided a semiconductor package manufacturing method as defined in any one of the first to seventh aspects, wherein the second conductor is covered with an insulative coating film made of a thermoplastic insulating resin, and the insulative coating film is removed or pushed aside by an effect of any one of heat, pressure, and vibration or a combination of these factors when connecting the second conductor to the first conductor, by which the second conductor and the first conductor are brought in contact and connected with each other.

According to a ninth aspect of the present invention, there is provided a semiconductor package manufacturing method as defined in any one of the first to eighth aspects, wherein a plurality of first conductors are connected to one electrode of the semiconductor.

According to a 10th aspect of the present invention, there is provided a semiconductor package manufacturing method as defined in any one of the first to ninth aspects, wherein the second conductor has at its one end a bent portion or an extruded protruding portion, the bent portion or the extruded protruding portion located at the one end of the second conductor is employed as the first conductor to be connected to the electrode of the semiconductor and the connection of the first conductor to the second conductor is eliminated.

According to an 11th aspect of the present invention, there is provided a semiconductor package manufacturing method as defined in any one of the first to 10th aspects, wherein the connecting portion that belongs to the first conductor and is connected to the second conductor is a tip portion of the first conductor.

According to a 12th aspect of the present invention, there is provided a semiconductor package manufactured by the semiconductor package manufacturing method defined in any one of the first to 11th aspects.

According to a 13th aspect of the present invention, there is provided a semiconductor package comprising:

a power supply semiconductor having electrodes on both its surface;

a heat sink connected to a lower electrode arranged on one surface of both the surfaces of the semiconductor;

a first conductor that has a spherical, convex, or rod-like shape and is connected to each of the first electrode and the second electrode arranged on the other surface of both the surfaces of the semiconductor;

a first insulating section of a first insulating resin for covering the semiconductor except a connecting portion of the first conductor and a lower surface of the heat sink; and a plate-shaped second conductor connected to the connecting portion of the first conductor.

According to a 14th aspect of the present invention, there is provided a semiconductor package comprising:

a power supply semiconductor having electrodes on both its surface;

a heat sink connected to a lower electrode arranged on one surface of both the surfaces of the semiconductor;

a first conductor that has a spherical, convex, or rod-like shape and is connected to each of the first electrode and the second electrode arranged on the other surface of both the surfaces of the semiconductor;

a plate-shaped second conductor connected to a connecting portion of the first conductor; and an insulating section for covering the semiconductor, the heat sink, the first conductor, and the second conductor with an insulating resin except a lower surface of the heat sink and a connecting portion of the second conductor.

According to a 15th aspect of the present invention, there is provided a semiconductor package as defined in the 13th or 14th aspect, wherein the first conductor has a stepped shape and includes a small-diameter portion to be fit in a hole of the second conductor, a large-diameter portion that is thicker than the small-diameter portion and able to be engaged with a periphery of the hole of the second conductor, and a stepped portion arranged at a boundary between the small-diameter portion and the large-diameter portion, and the second conductor is connected to the connecting portion of the first conductor by engaging the periphery of the hole of the second conductor with the large-diameter portion while fitting the small-diameter portion that serves as the connecting portion of the first conductor into the hole of the second conductor.

According to a 16th aspect of the present invention, there is provided a semiconductor package as defined in any one of the 13th to 15th aspects, wherein the first conductor is connected to the second conductor in a state in which a lower surface of the second conductor pushes against and comes into contact with an upper end surface of the first conductor.

According to a 17th aspect of the present invention, there is provided a semiconductor package as defined in any one of the 13th to 16th aspects, wherein the first conductor has an uneven portion on its side surface, and the first insulating resin twines around the uneven portion of the side surface of the first conductor.

According to an 18th aspect of the present invention, there is provided a semiconductor package as defined in any one of the 13th to 17th aspects, wherein the insulating resin has great thermal conductivity.

According to a 19th aspect of the present invention, there is provided a semiconductor package as defined in any one of the 13th to 18th aspects, wherein the second conductor is covered with an insulative coating film made of a thermoplastic insulating resin, and the insulative coating film is removed or pushed aside by an effect of any one of heat, pressure, and vibration or a combination of these factors when connecting the second conductor to the first conductor, by which the second conductor and the first conductor are brought in contact and connected with each other.

According to a 20th aspect of the present invention, there is provided a semiconductor package as defined in any one of the 13th to 19th aspects, wherein a plurality of first conductors are connected to one electrode of the semiconductor.

According to a 21st aspect of the present invention, there is provided a semiconductor package as defined in any one of the 13th to 20th aspects, wherein the second conductor has at its one end a bent portion or an extruded protruding portion, the bent portion or the extruded protruding portion located at the one end of the second conductor is employed as the first conductor to be connected to the electrode of the semiconductor and the connection of the first conductor to the second conductor is eliminated.

According to a 22nd aspect of the present invention, there is provided a semiconductor package as defined in any one of the 13th to 21st aspects, wherein the connecting portion that belongs to the first conductor and is connected to the second conductor is a tip portion of the first conductor.

The present invention is to connect the lower electrode of the semiconductor to the heat sink, directly conduct the radiated heat to the heat sink, and form the conductor of a copper plate in place of a gold wire or an aluminum wire. Moreover, by connecting the first electrode and the second electrode of the semiconductor to the conductor using a rod-shaped electrode thicker than a gold wire or an aluminum wire, there is provided a semiconductor package that is able to cope with a large current value and easy to secure a distance between the conductor and the semiconductor, giving solution to the aforementioned issues.

BRIEF DESCRIPTION OF THE DRAWINGS

These and other aspects and features of the present invention will become clear from the following description taken in conjunction with the preferred embodiments thereof with reference to the accompanying drawings, in which:

FIG. 6A is a sectional view taken along line B–B' in FIG. 6B and FIG. 6B is a sectional view of part of a semiconductor package according to a ninth embodiment of the present invention;

FIGS. 7A, 7B, and 7C are enlarged views of part of conductors of a semiconductor package according to a tenth embodiment of the present invention; and FIG. 8 is a sectional view of a conventional semiconductor package.

DETAILED DESCRIPTION OF THE PREFERRED EMBODIMENTS

Figure 1A:
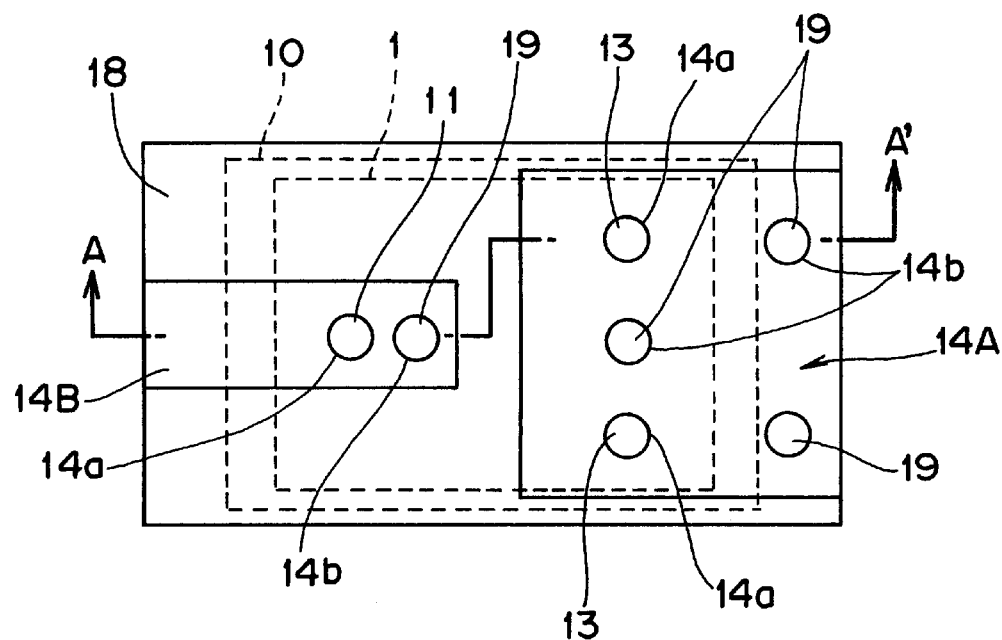
FIGS. 1A and 1B are a plan view and a sectional view taken along the line A–A' in FIG. 1A, respectively, of a semiconductor package according to a first, second, fourth, fifth and sixth embodiments of the present invention.

Before the description of the present invention proceeds, it is to be noted that like parts are designated by like reference numerals throughout the accompanying drawings.

Embodiments of the present invention will be described in detail below with reference to the drawings.

(First Embodiment)

Figure 1B:
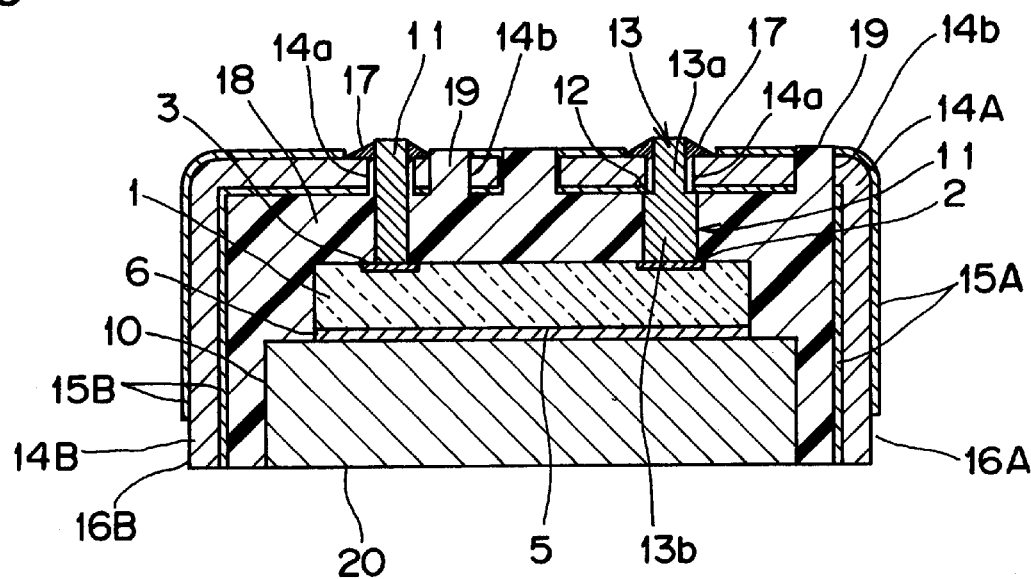

FIGS. 1A and 1B show a plan view and a sectional view of a semiconductor package according to the first embodiment of the present invention.

A semiconductor 1 has a lower electrode 5 on one surface, for example, the lower surface of both its upper and lower surfaces. The semiconductor 1 also has for example, on the upper surface an electronic circuit of the semiconductor 1 together with an upper a-electrode 2 and an upper b-electrode 3 (herein referred to as a "first electrode" and a "second electrode", respectively) for connecting the electronic circuit of the semiconductor 1 with another external circuit of the semiconductor 1. In FIGS. 1A and 1B, there are provided two first electrodes 2 and one second electrode 3.

The lower electrode 5 is mounted to a heat sink 10 by ultrasonic wave bonding with a connection material 6 of solder, conductive paste, gold or the like. If a eutectic solder is employed as the connection material 6, then the connection is achieved at a temperature of not lower than 280° C. If another solder having a melting point at a higher temperature is employed as the connection material 6, then the connection is achieved at a higher temperature. If a conductive paste is used as the connection material 6, then the connection can be achieved by the application of heat at a temperature of about 150 to 180° C. in the case of the generally employed epoxy resin system, also depending on the constituent material of the conductive paste. If gold is used as the connection material 6, the connection can be achieved by the application of heat at a temperature of about 100 to 250° C. and ultrasonic vibrations.

After connecting the lower electrode 5 to the heat sink 10 with the connection material 6, the lower end of a first conductor 11, which has a spherical, convex, or rod-like shape, is connected to each of the first electrodes 2 and the second electrode 3. FIGS. 1A and 1B show a typical state in which the lower end of a rod-shaped first conductor 11 is connected to the second electrode 3. A stepped convex first conductor 11 (stepped pin 13 according to a fourth embodiment described later) is connected to the first electrode 2, while a rod-shaped first conductor 11 is connected to the second electrode 3.

Each first conductor 11 is constructed of any one of copper, aluminum, gold, and silver or an alloy that includes at least one of these substances. If the first conductor 11 has a rod-like shape as the second electrode located at the left of FIG. 1A, then the rod is cut in a specified dimension and employed for the aforementioned connection.

The aforementioned connection is achieved by the same processing method as that of the aforementioned lower electrode 5 in the case of connection with solder and conductive paste. In the case of connection by ultrasonic waves, the metals are melted and connected with each other directly by ultrasonic vibrations with interposition of nothing between the first conductor 11 and the first electrode 2 and nothing between the first conductor 11 and the second electrode 3.

As described above, after the completion of the connection of the aforementioned specified members of the lower electrode 5, the first electrode 2, and the second electrode 3 to the semiconductor 1, there is formed a first insulating section 18 by covering the semiconductor with a first insulating resin by means of a die except the portion that belongs to each first conductor 11 and is connected to a second conductor 14, or more specifically, the upper end portion of each first conductor 11 and the lower surface of the heat sink 10. That is, for example, by inserting the semiconductor 1 that has undergone the connection into a die for injection molding and injecting melted first insulating resin into a cavity inside the die for the injection molding for the formation of the first insulating section 18, the whole body of the semiconductor 1, the heat sink 10, and the first conductor 11 except the upper end portion of each first conductor 11 and the lower surface of the heat sink 10 is covered with the first insulating resin, for the formation of the first insulating section 18.

The plate-shaped second conductor 14 is connected to each first conductor 11 and is constructed of a plate of copper or a copper alloy and, if necessary in terms of function, the conductor is subjected to specified surface processing. In FIGS. 1A and 1B, the plate-shaped second conductor 14 is constructed of a first electrode-use plate-shaped second conductor 14A that has a greater width for the connection with the two first electrodes 2 and a second electrode-use plate-shaped second conductor 14B that has a smaller width for the connection with the one second electrode 3. As shown in FIG. 1B, it is arbitrary whether the second conductors 14A and 14B are used with exterior surfaces that are covered with insulative coating films 15, i.e., 15A and 15B. If the surfaces are covered with the insulative coating films 15A and 15B, there can be expected the effects of assuring surface protection and insulation to the other components. However, this arrangement is to be adopted taking the costs into consideration. With regard to the shape, the second conductor 14A for the first electrode is provided with an electrode connection hole 14a into which the upper end portion of the first conductor 11 whose lower end is connected to the first electrode 2 is inserted and one fixation hole 14b into which one fixation protrusion 19 of the first insulating section 18 is inserted, and processed so as to be bent into a roughly L-shaped figure. The insulative coating film 15A is removed from the inner peripheral surface of the electrode connection hole 14a for connection to the first conductor 11 whose lower end is connected to the first electrode 2, an upper surface portion located around the electrode connection hole 14a, and a portion to be connected to a circuit board, i.e., a connecting portion 16A. With regard to the shape, the second conductor 14B for the second electrode is provided with two holes 14a into which the upper end portions of the two first conductors 11 whose lower end portions are connected to the two second electrodes 3 are inserted and three fixation holes 14b into which three fixation protrusions 19 of the first insulating section 18 are inserted, and processed so as to be bent into a roughly L-shaped figure. The insulative coating film 15B is removed from the inner peripheral surface of the electrode connection hole 14a for connection to the two first conductors 11 whose lower end portions are connected to the two second electrodes 3, an upper surface portion located around the electrode connection hole 14a, and a portion to be connected to the circuit board, i.e., a connecting portion 16B.

The first conductor 11 is inserted into the electrode connection hole 14a of each of the second conductors 14A and 14B processed as above, while each fixation protrusion 19 of the first insulating section 18 is inserted into and fixed to each fixation hole 14b of the second conductors 14A and 14B.

Next, the first conductors 11 and the peripheral portions of the electrode connection holes 14a of the second conductors 14A and 14B are electrically connected to each other with solder or a conductive paste 17.

According to the first embodiment, by employing the first conductor 11, which is a conductor that has a spherical, convex, or rod-like shape and is thicker than the gold wire or the aluminum wire 4 for the connection of the first electrode 2 and the second electrode 3 of the semiconductor 1 with the second conductors 14, 14A, and 14B and employing the plates of copper or a copper alloy for the second conductors 14, 14A, and 14B in place of the gold wire or the aluminum wire, there can be provided a semiconductor package that is able to cope with the large current value and is easy to secure the distance between the conductors 11, 14, 14A, and 14B and the semiconductor 1. By virtue of the direct connection of the lower electrode 5 of the semiconductor 1 to the heat sink 10, thermal conductivity from the semiconductor 1 to the heat sink 10 is very good, and this enables the absorption of generated heat of the semiconductor 1 in a very short time. This arrangement is particularly effective for thermal conductivity when heat is intermittently generated. Moreover, the plate-shaped second conductors 14A and 14B can be preparatorily formed into the respective required shapes of, for example, the aforementioned L-shaped figure, and this also has the effect that the dimensional stability, reliability, and workability are improved and heat radiation via the first conductors 11 and 13 is performed.

(Second Embodiment)

Although the first insulating section 18 is formed by connecting the first conductors 11 to the semiconductor 1 and thereafter covering them with the first insulating resin in the first embodiment, the present invention is not limited to this. That is, as a semiconductor package according to the second embodiment of the present invention, it is acceptable to form the first insulating section 18 by connecting the first conductors 11 to the second conductors 14A and 14B and thereafter covering with the first insulating resin the whole body of the semiconductor 1, the heat sink 10, and the first conductor 11 except the lower surface of the heat sink 10.

According to the second embodiment, the first insulating section 18 is formed by connecting the first conductors 11 to the second conductors 14A and 14B and thereafter molding them into an integrated body with the first insulating resin. Therefore, the fixation of the first conductors 11 to the plate-shaped second conductors 14A and 14B can be stably achieved.

(Third Embodiment)

Figure 2A:
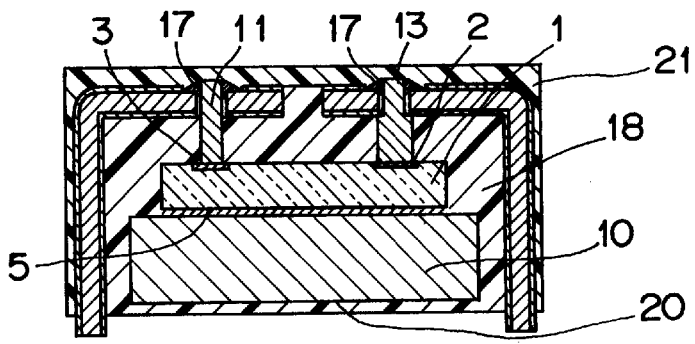
FIGS. 2A and 2B are sectional views of a semiconductor package according to a third embodiment of the present invention, in a state before the exposure of the connecting portion and a state after the exposure of the connecting portion, respectively, of a second conductor.
Figure 2B:
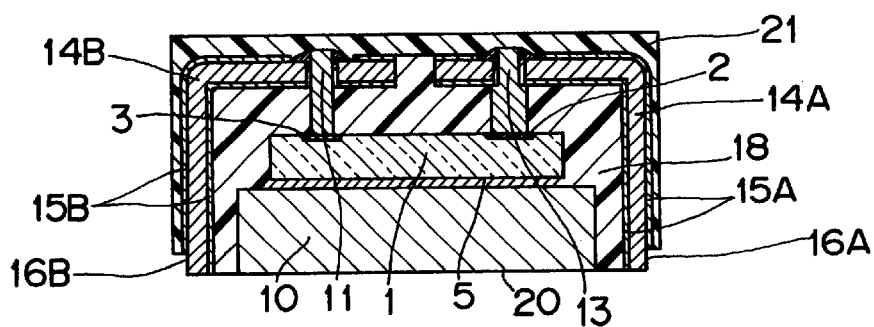

FIGS. 2A and 2B are sectional views of a semiconductor package according to the third embodiment of the present invention.

A second insulating section 21 is formed by inserting the semiconductor package manufactured according to each of the first and second embodiments into a forming die, thereafter injecting melted second insulating resin so as to perform injection molding for the formation of the second insulating section 21 and covering with the second insulating resin all of the upper surface and the side surfaces of the semiconductor package (see FIG. 2A). Subsequently, the connecting portions 16A and 16B are exposed by cutting away and removing the second insulating resin covering the connecting portions 16A and 16B necessary for mounting the second conductor 14A for the first electrode and the second conductor 14B for the second electrode on a circuit board, or the connecting portions 16A and 16B are exposed by dissolving the second insulating resin of the connecting portions by a chemical method (see FIG. 2B). The chemical method generally has the steps of performing dissolution by means of acid, thereafter performing neutralization with alkali, and performing washing in clear water. In this stage, the side of the second conductor 14 on which terminals to be connected to the circuit board are formed is lengthened so as to extend below the heat sink 10 as shown in FIG. 2A, by which the extended portion can be used for fixation in the die when molding the second insulating resin. By removing the extended portion together with the second insulating resin in the cutting stage, it is easy to obtain flatness with respect to a lower surface 20 of the heat sink 10 and the lower end surfaces of the second conductors 14A and 14B, and the mounting on the circuit board can be performed with a higher degree of accuracy.

Figure 3A:
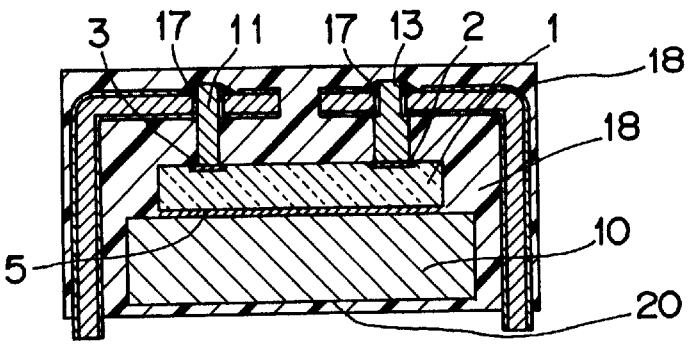
FIGS. 3A and 3B are sectional views of a semiconductor package according to a modified example of the third embodiment of the present invention, in a state before the exposure of the connecting portion and a state after the exposure of the connecting portion, respectively, of a second conductor.
Figure 3B:
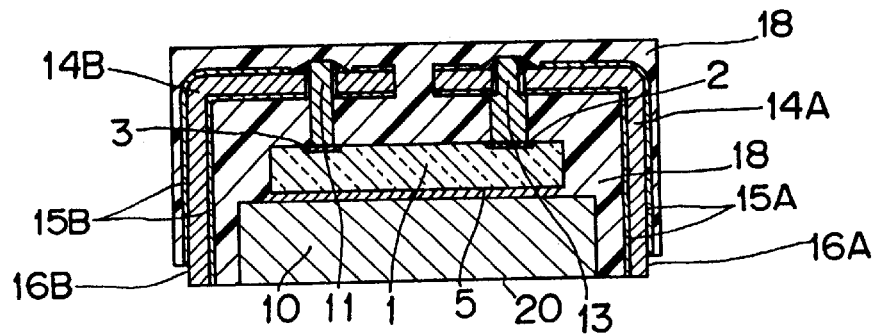

As another method, as shown in FIGS. 3A and 3B, when forming the first insulating section 18 with the cover of the first insulating resin of the second embodiment, it is acceptable to form the first insulating section 18 by covering with the first insulating resin the whole, i.e., all the exposed surfaces of the semiconductor 1 and the heat sink 10 including the front and rear surfaces of the second conductor 14A for the first electrode and the second conductor 14B for the second electrode by means of a forming die as shown in FIG. 3A, and thereafter exposing the connecting portions 16A and 16B of the second conductor 14A for the first electrode and the second conductor 14B for the second electrode. In this stage, the side of the second conductor 14 on which terminals to be connected to the circuit board are formed is lengthened so as to extend below the heat sink 10 as shown in FIG. 3A, by which the extended portion can be used for fixation in the die when molding the first insulating resin. By removing the extended portion together with the first insulating resin in the cutting stage, it is easy to obtain flatness with respect to the lower surface 20 of the heat sink 10 and the lower end surfaces of the second conductors 14A and 14B, and the mounting on the circuit board can be performed with a higher degree of accuracy.

According to the third embodiment, the first insulating section 18 or the second insulating section 21 is formed by covering the whole body of the semiconductor package with the first insulating resin or the second insulating resin, and the three members of the second conductor 14A for the first electrode, the second conductor 14B for the second electrode, and the heat sink 10 are concurrently shaped by cutting. Therefore, the smoothness of the mounting surface at the time of mounting on the circuit board is improved. Moreover, the first or second insulating section 18 or 21 is formed by covering the whole body with the first or second insulating resin, and this has the effect that insulation with respect to the adjacent components after mounting can reliably be achieved by virtue of the stabilization in shape and the exposure of only the connecting portions 16A and 16B.

(Fourth Embodiment)

A semiconductor package according to the fourth embodiment has a construction in which the first conductor 11 is constructed as a stepped pin 13 instead of the rod-shaped one, and this conductor is shown as the one for the first electrode in the semiconductor package shown in FIGS. 1A and 1B.

With regard to the shape, the stepped pin 13 has a small-diameter portion 13a to be fit in the hole 14a of the second conductor 14A or 14B and a large-diameter portion 13b that is thicker than the above portion and is able to be engaged with the periphery of the hole 14a of the second conductor 14A or 14B, while a stepped portion 12 is formed at the boundary between the small-diameter portion 13a and the large-diameter portion 13b. Therefore, as for the stepped pin 13, the end surface of the large-diameter portion 13b is connected to the first electrode 2 or the second electrode 3 of semiconductor 1. When the small-diameter portion 13a, which is the narrower portion of the stepped pin 13, is fit and inserted in the hole 14a of the second conductor 14A or 14B that has an inside diameter roughly equal to that of the small-diameter portion 13a, the peripheral portion of the hole 14a of the second conductor 14A or 14B is engaged with the stepped portion 12, and this determines the distance between the second conductor 14A or 14B and the semiconductor 1, allowing the mounting of the second conductor 14A or 14B on the semiconductor 1 to be effectively performed in the state in which the specified distance is secured.

According to the fourth embodiment, the first conductor 11 is constructed of the stepped pin 13 that has the stepped shape. This arrangement has the effect that the position of the plate-shaped second conductors 14A and 14B are regulated by the stepped portion 12 when inserted and fitted into the hole 14a of the plate-shaped second conductors 14A and 14B, allowing the distance to the semiconductor 1 to be easily kept constant and the effect that the outflow of solder or conductive paste 17 for connecting the second conductors 14A and 14B with the first conductor 11 can be prevented.

(Fifth Embodiment)

A semiconductor package according to the fifth embodiment will be described with reference to FIGS. 4A and 4B.

Figure 4A:
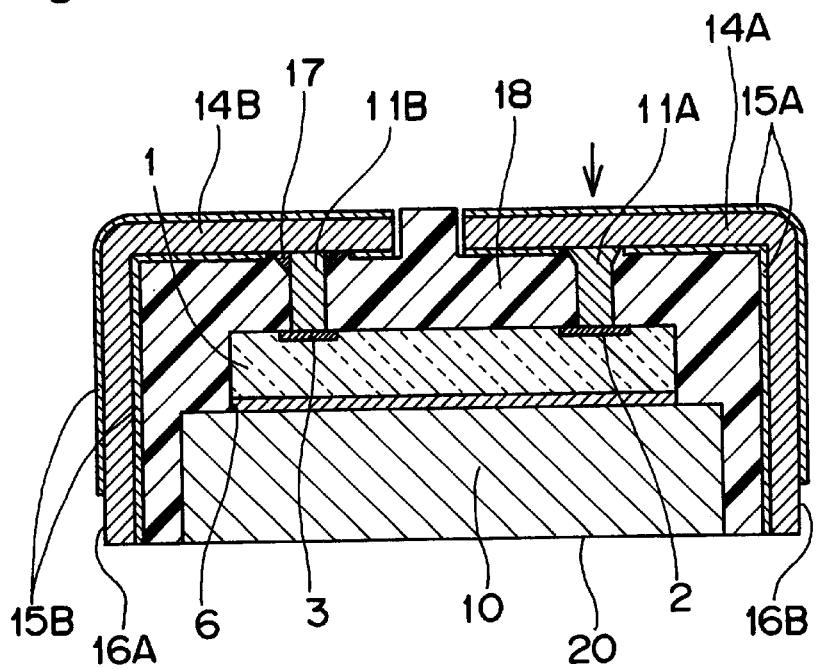
FIGS. 4A and 4B are a sectional view of a semiconductor package according to a fifth embodiment of the present invention and a sectional view of part of the package in a state before the connection of the second conductor, respectively.
Figure 4B:
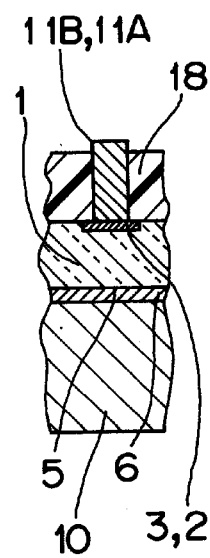

FIG. 4A shows two types of methods for connecting the first conductors 11A and 11B with the second conductors 14A and 14B. The second conductors 14A and 14B employed herein have no electrode connection hole 14a for the first conductors 11A and 11B.

Reference is first made to the connecting method at the left of FIG. 4A. According to this method, the first insulating section 18 is formed by means of a die by connecting the lower end surface of the rod-shaped first conductor 11B cut in a specified length to secure a distance to the semiconductor 1 to the second electrode 3 of the semiconductor 1 and covering the periphery of the conductor with the first insulating resin so that the upper end surface is not buried in the first insulating resin as shown in FIG. 4B. Next, solder or a conductive paste 17 is supplied to the upper end surface of the first conductor 11B, and the second conductor 14B that has no insertion hole for the first conductor 11B is placed on the upper end surface of the first conductor 11B. The conductor is heated to connect the upper end surface of the first conductor 11B with the lower surface of the second conductor 14B by means of solder or the conductive paste 17.

It is acceptable to supply the solder or conductive paste 17 to a portion that belongs to the second conductor 14B and corresponds to the first conductor 11B and thereafter to connect the second conductor 14B to the first conductor 11B.

It is also acceptable to perform the covering work with the first insulating resin by means of the die after the connection of the first conductor 11B with the second conductor 14B.

Reference is next made to the method at the right of FIG. 4A. According to this method, the first conductor 11 is connected to the semiconductor 1 in a manner similar to the aforementioned one. That is, the lower end surface of the rod-shaped first conductor 11A cut in the specified length to secure the distance to the semiconductor 1 is connected to the first electrode 2 of the semiconductor 1. Next, the first insulating section 18 is formed by means of a die by covering the periphery of the conductor with the first insulating resin so that the upper end surface is not buried in the first insulating resin as shown in FIG. 4B, and the protruding portion of the upper end surface of the first conductor 11A protrudes by about 100 μm.

The second conductor 14A is placed on this first conductor 11A, and ultrasonic vibrations are applied downward in the direction of arrow in FIG. 4A, connecting the upper end surface of the first conductor 11A with the lower surface of the second conductor 14A. Consequently, as shown in FIG. 4A, the upper end surface of the first conductor 11A is expanded in a trapezoidal shape in terms of the cross section thereof. It is also acceptable to perform the work of forming the first insulating section 18 by the covering with the first insulating resin by means of the die after the connection of the first conductor 11A with the second conductor 14A.

According to the fifth embodiment, the connection of the first conductors 11A and 11B with the plate-shaped second conductors 14A and 14B is established between the upper end surfaces of the first conductors 11A and 11B and the lower surfaces of the second conductors 14A and 14B. This arrangement can eliminate the work of processing the electrode connection holes of the plate-shaped second conductors 14A and 14B and the work of inserting the second conductors 14A and 14B into the holes of the first conductors 11A and 11B and permits the simple positional alignment of the upper end surfaces of the first conductors 11A and 11B with the lower surfaces of the second conductors 14A and 14B. This arrangement has the effect of achieving cost reduction by virtue of the improvement in workability and further dimensional reduction by virtue of the elimination of the protruding portions on the upper surfaces of the connecting portions of the first conductors 11A and 11B and the second conductors 14A and 14B.

(Sixth Embodiment)

Figure 5:
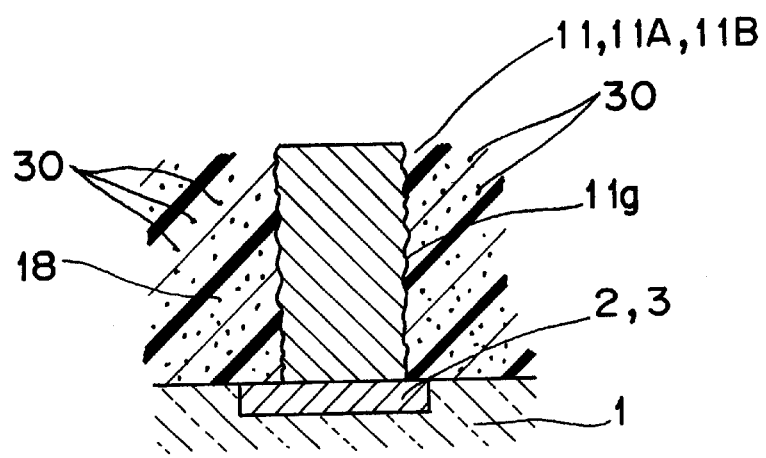
FIG. 5 is a sectional view of a semiconductor package according to sixth and seventh embodiments of the present invention.

A semiconductor package according to the sixth embodiment will be described with reference to FIG. 5.

This sixth embodiment can be applied to the first conductors 11, 11A, and 11B of each of the aforementioned embodiments. A fine uneven (rugged) portion 11g is provided on the outer peripheral surface of the first conductors 11, 11A, and 11B except the upper and lower end surfaces.

If the fine uneven portion 11g is provided as described above, the melted first insulating resin twines around the uneven portion 11g when the first insulating section 18 is formed by covering the first conductors 11, 11A, and 11B with the first insulating resin or, for example, when it is molded inside the forming die, as a consequence of which the first insulating resin and the first conductors 11, 11A, and 11B come to be tightly connected to each other. This arrangement is able to prevent the looseness and movement of the first conductors 11, 11A, and 11B due to an external stress, disperse the external stress, and prevent stress concentration on one portion.

That is, according to the sixth embodiment, in which the uneven portion 11g is provided on the surfaces of the side portions of the first conductors 11, 11A, and 11B, the first insulating resin is molded in conformity to the uneven portion 11g and both the members are tightly connected to each other when the side portions of the first conductors 11, 11A, and 11B are covered with the first insulating resin. Therefore, the external force is dispersed toward the insulating resin side when an external force is applied to the first conductors 11, 11A, and 11B. Particularly in the case where the first conductors 11, 11A, and 11B are bonded by the solder 17 or ultrasonic waves on the lower surfaces of the plate-shaped second conductors 14A and 14B as in the fourth embodiment, a force for pressing the first conductors 11, 11A, and 11B by the second conductors 14A and 14B is exerted. This arrangement has the effect that the above-mentioned pressing force can be dispersed by integrating the first conductors 11, 11A, and 11B with the first insulating resin and the effect that the direct application of the pressing force partially to the semiconductor 1 can be prevented.

(Seventh Embodiment)

A semiconductor package according to the seventh embodiment will be described with reference to FIG. 5.

The insulating resin such as the first insulating resin or the second insulating resin for forming the insulating sections 18 or 21 or the like is mixed with fine particles of alumina, boron, or the like, which are materials having an insulating property, a good thermal conductivity, and a diameter of about 0.5 to 50 μm or scales 30 of a similar size, improving the thermal conductivity of the portion of the insulating resin. With this arrangement, heat of the semiconductor 1 can be radiated not only from the heat sink 10 but also from the surface of the insulating resin. The amount of the fine particles 30 to be mixed with the insulating resin may preferably be changed according to the purpose of use.

According to the seventh embodiment, the semiconductor 1 can be covered with the insulating resin of a great thermal conductivity, and therefore, heat can be conducted to the insulating resin that is covering the periphery of the semiconductor 1 concurrently with the conduction of heat directly from the semiconductor 1 to the heat sink 10. This arrangement has the effect that the heat is radiated from the members other than the heat sink 10 and the effect that the temperature of the semiconductor 1 can be reduced earlier.

(Eighth Embodiment)

A semiconductor package according to the eighth embodiment will be described.

The insulative coating films 15A and 15B covering the front surfaces and the rear surfaces of the second conductors 14A and 14B are formed of, for example, a resin that is softened or melted at a temperature of not lower than 100° C. so as to have a thickness of 10 to 50 μm. The resin to be employed is a thermoplastic resin such as urethane resin or vinyl chloride. If soldering is performed from above the insulative coating films 15A and 15B on the second conductors 14A and 14B of which the front surfaces and the rear surfaces are covered with the above-mentioned resin when connecting by soldering the metal of the first conductors 11, 11A, and 11B and the metal of the second conductors 14A and 14B or the metal of the connecting portions 16A and 16B of the second conductors 14A and 14B and the metal of other conductors, then the insulative coating films 15A and 15B are softened by being melted by the heat of the melted solder or the heat of the soldering iron for melting the solder. Then the solder pushes the insulative coating films 15A and 15B aside to expose the metal surfaces of the second conductors 14A and 14B. When the metal surfaces are exposed, the metal surfaces of the second conductors 14A and 14B can be made solderable similarly to the normal soldering.

In the case of ultrasonic bonding, an ultrasonic wave transmitter is pressed against the insulative coating films 15A and 15B so as to transmit ultrasonic vibrations to the second conductors 14A and 14B via the insulative coating films 15A and 15B. Consequently, frictional heat is generated between the first conductors 11, 11A, and 11B and the second conductors 14A and 14B by the ultrasonic vibrations. This heat melts the insulative coating films 15A and 15B located between the first conductors 11, 11A, and 11B and the second conductors 14A and 14B, while the pressure application concurrently pushes aside the insulative coating films 15A and 15B melted by the above-mentioned heat to expose the metal surfaces of the second conductors 14A and 14B. The metal of the first conductors 11, 11A, and 11B is brought into contact with the metal of the second conductors 14A and 14B or the metal of the connecting portions 16A and 16B of the second conductors 14A and 14B is brought in contact with the metal of other conductors. By further applying ultrasonic vibrations, the metal of the first conductors 11, 11A, and 11B is melted with the metal of the second conductors 14A and 14B or the metal of the connecting portions 16A and 16B of the second conductors 14A and 14B is melted with the metal of other conductors, achieving the ultrasonic connecting.

According to the eighth embodiment, of which the insulative coating films 15A and 15B are thermoplastic, the insulative coating films 15A and 15B are removed or pushed aside by the effect of any one of heat, pressure, and vibration or the multifunction of an arbitrary combination of them at the time of connecting the conductors 11, 11A, 11B, 14A, and 14B, as a consequence of which the conductors are brought in contact or electrically connected with each other for the achievement of bonding. Therefore, when the plate-shaped second conductors 14A and 14B are covered with the thin thermoplastic insulative coating films 15A and 15B, after the softening or melting of the insulative coating films 15A and 15B by the heat of the solder or the vibrations and heat generated by the ultrasonic waves in the connecting stage, the films are pushed aside by the solder or the first conductors 11, 11A, and 11B, exposing the metal surfaces of the plate-shaped second conductors 14A and 14B, as a consequence of which the second conductors are brought into contact or connected to the first conductors 11, 11A, and 11B or other conductors. This arrangement has the effect that the specific process for removing the insulative coating films 15A and 15B in the conductor connecting portions can be eliminated and the effect that the risk of short-circuit can be removed since the portions other than the connecting portions are covered with the insulative coating films 15A and 15B of an insulating resin.

(Ninth Embodiment)

FIGS. 6A and 6B show a sectional view and a plan view of a semiconductor package according to the ninth embodiment.

In connecting the first conductors 11 for connection to other conductors, a plurality of (three in FIGS. 6A and 6B) first conductors 11 are connected to one first electrode 2 or 3 of the semiconductor 1. In this case, all of the plurality of first conductors 11 cannot be connected when the first electrode 2 or 3 has a small pad area. Therefore, it is acceptable to reduce the diameter of each first conductor 11 and connect the conductors to the electrode 2 or 3.

Moreover, although the second conductors 14A and 14B having no fitting hole are employed in FIGS. 6A and 6B, it is acceptable to make an electrode connection hole 14$a$ through the second conductors 14A and 14B and insert the first conductors 11, 11A, and 11B into the electrode connection hole 14$a$, for the achievement of connection.

According to the ninth embodiment, a plurality of first conductors 11, 11A, and 11B are employed for the pad of one electrode 2 or 3 of the semiconductor 1. This arrangement has the effects of increasing the available current capacity and improving the reliability of connection by employing a plurality of first conductors 11, 11A, and 11B.

(Tenth Embodiment)

A semiconductor package according to the tenth embodiment will be described with reference to FIGS. 7A, 7B, and 7C.

The tenth embodiment is obtained by integrating the first conductors 11, 11A, and 11B with the second conductors 14A and 14B. Each method is to process the tip portion that belongs to the second conductors 14A and 14B and is located at the electrodes of the semiconductor 1.

In FIG. 7A, a V-shaped bent portion 14$m$ is formed by bending the tip portions of the second conductors 14A and 14B into a roughly V-shaped figure, and the bent portion 14$m$ is connected to the first electrode 2 or 3 of the semiconductor 1 with solder or conductive paste.

In FIG. 7B, a protruding portion 14$n$ having a roughly conical, pyramidal, or columnar shape is formed by forming two roughly parallel slits at the tip portions of the second conductors 14A and 14B and bending downward the portion interposed between the two slits, and the protruding portion 14$n$ is connected to the first electrode 2 or 3 of the semiconductor 1 with solder or conductive paste.

In FIG. 7C, a protruding portion 14$p$ having a roughly conical, pyramidal, or columnar shape is formed by extrusion at the tip portions of the second conductors 14A and 14B, and the protruding portion 14$p$ is connected to the first electrode 2 or 3 of the semiconductor 1 with solder or conductive paste.

It is to be noted that the bent portion 14$m$ and the protruding portions 14$n$ and 14$p$ to be connected to the semiconductor 1 are sometimes plated with another metal of gold, silver, or the like.

According to the tenth embodiment, the bent portion 14$m$ or the protruding portion 14$n$ or 14$p$ is provided at one end of the second conductor 14A, 14B, and the first conductors 11, 11A, and 11B are integrated with the plate-shaped second conductors 14A and 14B. Therefore, by partially aligning in position the second conductor 14A, 14B with the first electrode 2 or 3 of the semiconductor 1, providing the bent portion 14$m$ or the protruding portion 14$n$ or 14$p$ and connecting this portion to the first electrode 2 or 3 of the semiconductor 1, there are the effects of eliminating the first conductors 11, 11A, and 11B and the connecting portions and reducing the coat by improving the reliability and reducing the number of processes.

As described above, according to the first through tenth embodiments, a semiconductor package of a large current and a large calorific value (for example, a calorific value of not smaller than 1 W) can be manufactured at low cost.

It is to be noted that the present invention is limited to none of the aforementioned embodiments and allowed to be put into practice in a variety of forms.

For example, in the first through tenth embodiments, the lower end of the first conductor 11 that has the spherical, convex, or rod-like shape is connected to each of the first electrode 2 and the second electrode 3 after the connection of the lower electrode 5 to the heat sink 10 with the bonding material 6. However, conversely, it is acceptable to connect the lower electrode 5 to the heat sink 10 with the bonding material 6 after the connection of the lower end of the first conductor 11 that has the spherical, convex, or rod-like shape to each of the first electrode 2 and the second electrode 3.

It is to be noted that the effects provided by the embodiments can be produced by appropriately combining the arbitrary embodiments of the aforementioned various embodiments.

According to the present invention, the first conductor that is employed as the spherical, convex, or rod-shaped conductor is thicker than the gold wire or the aluminum wire for the connection of the first electrode and the second electrode of the semiconductor with the second conductor. If the second conductor is provided by a plate-shaped one in place of the gold wire or the aluminum wire, then there can be provided a semiconductor package that can cope with a large current value and is easy to secure the distance between the conductors and the semiconductor. Therefore, a compact semiconductor package of a large calorific value for use in a power supply circuit of equipment can be manufactured at low cost while satisfying the workability and reliability.

That is, the lower electrode of the semiconductor is directly bonded to the heat sink according to the present invention. Therefore, the thermal conductivity from the semiconductor to the heat sink is very good, and this allows the heat radiation of the semiconductor to be absorbed in a very short time and allows the heat radiation characteristic of the semiconductor of a large calorific value as in a power supply circuit or the like to be improved. In particular, this arrangement is effective for thermal conductivity when heat is intermittently generated. Moreover, the arrangement has the effects that the second conductors can be each preparatorily formed into the required shape of, for example, the aforementioned L-figured plate-like shape, assuring good dimensional stability, improved reliability, improved workability, and heat radiation via the first conductors.

Moreover, according to the present invention, in the case where the first conductor and the second conductor are connected with each other and thereafter integrally covered with the first insulating resin to form the first insulating section, the fixation of the first conductor and the second conductor can be more stably achieved.

Moreover, according to the present invention, in the case where the first insulating section or the second insulating section is formed by covering the whole body of the semiconductor package with the first insulating resin or the second insulating resin and the three members of the second conductor for the first electrode, the second conductor for the second electrode, and the heat sink are concurrently formed by cutting, there is improved smoothness of the mounting surface for mounting on a circuit board. Moreover, the first or second insulating section is formed by covering the whole body with the first or the second insulating resin. This arrangement has the effect that insulation with respect to the adjacent components after mounting can be reliably achieved by virtue of the stabilization of shape and the exposure of only the connecting portions.

Moreover, according to the present invention, in the case where the first conductor is constructed of the stepped pin that has a stepped shape and inserted into and connected to the hole of the second conductor, the second conductor is regulated in position by the stepped portion, allowing the distance to the semiconductor to be easily kept constant. This arrangement has the effect that the outflow of the solder or conductive paste for connecting the second conductor with the first conductor can be prevented.

Moreover, according to the present invention, in the case where the first conductor is connected with the second conductor by the upper end surface of the first conductor and the lower surface of the second conductor, the work of processing the electrode connection hole of the second conductor and the work of inserting the second conductor into the hole of the first conductor can be eliminated, and only the simple positional alignment of the upper end surface of the first conductor with the lower surface of the second conductor is required. This arrangement has the effect that cost reduction by virtue of the improvement in workability and a further reduction in size by virtue of the elimination of protruding portions on the upper surface of the connecting portions of the first conductor and the second conductor can be achieved.

Moreover, according to the present invention, in the case where the surface of the side portion of the first conductor has the uneven portion, the first insulating resin is molded in conformity to the uneven portion when the side portion of the first conductor is covered with the first insulating resin, allowing both the members to be tightly connected with each other. Therefore, when an external force is applied to the first conductor, the external force is dispersed toward the insulating resin side. Particularly, in the case where the first conductor is connected by the solder or the like or ultrasonic bonding on the lower surface of the second conductor as described hereinabove, a force for pressing the first conductor by the second conductor is exerted. This arrangement has the effect that the above-mentioned pressing force can be dispersed by integrating the first conductor with the first insulating resin for the prevention of the direct application of the pressing force to a part of the semiconductor.

Moreover, according to the present invention, in the case where the semiconductor is covered with the insulating resin of a great thermal conductivity, heat can be conducted also to the insulating resin that is covering the periphery of the semiconductor concurrently with the direct thermal conduction from the semiconductor to the heat sink. This arrangement has the effect that the heat is radiated from the members other than the heat sink and the effect that the temperature of the semiconductor can be reduced earlier.

Moreover, according to the present invention, in the case where the insulative coating film is thermoplastic, the insulative coating film is removed or pushed aside by the effect of any one of heat, pressure, and vibration or the multifunction of an arbitrary combination of them at the time of connecting the conductors, as a consequence of which the conductors are brought in contact or electrically connected with each other for the achievement of bonding. Therefore, when the second conductor is covered with the thin thermoplastic insulative coating film, after the softening or melting of the insulative coating film by the heat of the solder or the vibrations and heat generated by the ultrasonic waves in the connecting stage, the film is pushed aside by the solder or the first conductors, exposing the metal surfaces of the second conductors, as a consequence of which the second conductors are brought in contact or connected to the first conductors or other conductors. This arrangement has the effect that the specific process for removing the insulative coating film in the conductor connecting portions can be eliminated and the effect that the risk of short-circuit can be removed since the portions other than the connecting portions are covered with the insulative coating film of an insulating resin.

Moreover, according to the present invention, in the case where the plurality of first conductors are employed for the pad of one electrode of the semiconductor, there are the effects of increasing the available current capacity and improving the reliability of the connection by employing a plurality of first conductor.

Moreover, according to the present invention, in the case where the integration of the first conductor with the second conductor is achieved by providing one end of the second conductor with the bent portion or the protruding portion, by aligning a part of the second conductor with the electrode position of the semiconductor, providing the bent portion or the protruding portion and connecting this portion with the electrode of the semiconductor, the removal of the first conductor and the connecting portion can be achieved. This arrangement has the effect that cost reduction can be achieved by virtue of the improvement of reliability and the reduction in number of processes.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A semiconductor package comprising:
   a power supply semiconductor having upper and lower surfaces;
   at least one first electrode connected to the upper surface of the power supply semiconductor;
   at least one second electrode connected to the upper surface of the power supply semiconductor;
   a lower electrode connected to the lower surface of the power supply semiconductor;
   a heat sink connected to the lower electrode;
   a plurality of first conductors connected to the first and second electrodes, respectively, wherein each of the first conductors has a spherical, convex, or rod-like shape;
   a first insulating section formed of an insulating resin for covering the semiconductor except at a connecting portion of each of the first conductors and a lower surface of the heat sink; and
   a plate-shaped second conductor connected to the connecting portions of the first conductors.

2. A semiconductor package as claimed in claim 1, wherein at least one of the first conductors has a stepped shape and includes a small-diameter portion fitted in a hole of the second conductor, a large-diameter portion that is thicker than the small-diameter portion and able to be engaged with a periphery of the hole of the second conductor, and a stepped portion arranged at a boundary between the small-diameter portion and the large-diameter portion, and the second conductor is connected to the connecting portion of the at least one first conductor by engaging the periphery of the hole of the second conductor with the large-diameter portion while fitting the small-diameter portion that serves as the connecting portion of the at least one first conductor into the hole of the second conductor.

3. A semiconductor package as claimed in claim 1, wherein at least one of the first conductors is connected to the second conductor in a state in which a lower surface of the second conductor pushes against and comes into contact with an upper end surface of the at least one first conductor.

4. A semiconductor package as claimed in claim 1, wherein at least one of the first conductors has an uneven portion on its side surface, and the insulating resin twines around the uneven portion of the side surface of the at least one first conductor.

5. A semiconductor package as claimed in claim 1, wherein the insulating resin has great thermal conductivity.

6. A semiconductor package as claimed in claim 1, wherein the second conductor is covered with an insulative coating film made of a thermoplastic insulating resin, and the insulative coating film is removed or pushed aside by an effect of any one of heat, pressure, and vibration or a combination of these factors when connecting the second conductor to the first conductors, by which the second conductor and the first conductors are brought in contact and connected with each other.

7. A semiconductor package as claimed in claim 1, wherein at least two first conductors are connected to one of the first and second electrodes.

8. A semiconductor package as claimed in claim 1, wherein the second conductor has at one end a bent portion or an extruded protruding portion, the bent portion or the extruded protruding portion located at the one end of the second conductor is employed as one of the first conductors.

9. A semiconductor package as claimed in claim 1, wherein each of the connecting portions of the first conductors comprises a tip portion of the corresponding first conductor.

10. A semiconductor package comprising:
    a power supply semiconductor having upper and lower surfaces;
    at least one first electrode connected to the upper surface of the power supply semiconductor;
    at least one second electrode connected to the upper surface of the power supply semiconductor;
    a lower electrode connected to the lower surface of the power supply semiconductor;
    a heat sink connected to the lower electrode;
    a plurality of first conductors connected to the first and second electrodes, respectively, wherein each of the first conductors has a connecting portion and a spherical, convex, or rod-like shape;
    a plate-shaped second conductor connected to the connecting portions of the first conductors; and
    an insulating section formed of an insulating resin for covering the semiconductor, the heat sink, the first conductors, and the second conductor except at a lower surface of the heat sink and a connecting portion of the second conductor.

* * * * *